US005835932A

United States Patent [19]

Rao

[11] Patent Number: 5,835,932

[45] Date of Patent: Nov. 10, 1998

[54] METHODS AND SYSTEMS FOR MAINTAINING DATA LOCALITY IN A MULTIPLE MEMORY BANK SYSTEM HAVING DRAM WITH INTEGRAL SRAM

[75] Inventor: G. R. Mohan Rao, Dallas, Tex.

[73] Assignee: Silicon Aquarius, Inc.

[21] Appl. No.: 816,663

[22] Filed: Mar. 13, 1997

[51] Int. Cl.[6] ........ G06F 12/00

[52] U.S. Cl. ........ 711/5; 365/230.03; 711/170

[58] Field of Search ........ 711/5, 170, 122; 365/230.03, 189.04

[56] References Cited

U.S. PATENT DOCUMENTS

| | | | |
|---|---|---|---|
| 4,897,770 | 1/1990 | Ward et al. | 711/128 |
| 5,226,009 | 7/1993 | Arimoto | 365/189.04 |
| 5,269,010 | 12/1993 | MacDonald | 711/5 |
| 5,680,363 | 10/1997 | Dosaka et al. | 365/230.03 |
| 5,699,317 | 12/1997 | Sartore et al. | 365/230.06 |
| 5,721,862 | 2/1998 | Sartore et al. | 365/189.04 |
| 5,761,694 | 6/1998 | Rao | 711/5 |

OTHER PUBLICATIONS

"DM 2202/2212 EDRAM 1mb×4 Enhanced Dynamic RAM" Product Specification/Enhanced Memory System, Inc. pp. 1–20 to 1–36 .

"DM2203/2213 MultiBank EDO EDRAM 512kb×8 Enhanced Dynamic RAM" Preliminary Data Sheet by Enhanced Memory Systems, Inc. pp. I–37 to I–57.

Ramtron, "Specialty Memory Products", DM2223/2233 Sync Bursting EDRAM 512Kb×8 Enhanced Dynamic RAM, Ramtron International Corp., 719–481–7000, pp. 2–57 to 2–62.

*Primary Examiner*—Tod R. Swann
*Assistant Examiner*—Felix B. Lee
*Attorney, Agent, or Firm*—James J. Murphy, Esq.; Winstead SEchrest & Minick, P.C.

[57] ABSTRACT

A memory 400 comprises a plurality of banks 401 and global access control circuitry 406. Each of the plurality of banks includes first and second arrays 506, 402 of memory cells, first accessing circuitry 413, 507 for selectively accessing cells in the first array in response to address bits, and second accessing circuitry 404, 413 for selectively accessing cells in the second array in response to address bits. Storage circuitry 502 within each bank 401 stores previously received address bits. Circuitry for comparing 503 within each bank compares received address bits with stored address bits in storage circuitry 503, with first accessing circuitry 413, 507 accessing cells in first array 506 addressed by the stored address bits when stored address bits and received address bits match and second accessing circuitry 404, 413 accessing cells in second array 402 addressed by the received address bits when the stored address bits and the received address bits differ. Global access control circuitry 406 enables comparison of the stored address and the received address in a selected one of the plurality of banks 401.

26 Claims, 5 Drawing Sheets

200B

METHODS AND SYSTEMS FOR MAINTAINING DATA LOCALITY IN A MULTIPLE MEMORY BANK SYSTEM HAVING DRAM WITH INTEGRAL SRAM

TECHNICAL FIELD OF THE INVENTION

The present invention relates in general to electronic memories and in particular to a dynamic random access memory (DRAM) with integral static random access memory (SRAM, and systems and methods using the same.

BACKGROUND OF THE INVENTION

Currently available dynamic random access memories (DRAMs) are generally based upon architectures which share the following characteristics. First,the typical general purpose DRAM has a single data port for writing and reading data to and from addressed storage locations ("dual ported" DRAMs are available which provide two data ports, typically one random and one serial port, however, these devices are normally limited to special memory applications). Second, data writes and reads are only made on a location by location basis, with each location typically being one bit, one byte or one word wide. Specifically, in a "random access mode", an access (read or write) is made to a single location per row address strobe (/RAS) active cycle and in a "page mode" an access is made to a single location per column address strobe (/CAS) or master clock cycle of the row addressed during the given /RAS cycle. Third, no method has generally been established to handle contention problems which arise when simultaneous requests for access are made to the same DRAM unit. Current techniques for handling contention problems depend on the DRAM and/or system architecture selected by the designer and range, for example, from "uniform memory-noncontention" methods to "non-uniform memory access" (NUMA) methods.

Similarly, the system architectures of personal computers (PCs) generally share a number of common features. For example, the vast majority of today's PCs are built around a single central processing unit (CPU), which is the system "master." All other subsystems, such as the display controller, disk drive controller, and audio controller then operate as slaves to the CPU. This master/slave organization is normally used no matter whether the CPU is a complex instruction set computer (CISC), reduced instruction set computer (RISC), Silicon Graphics MIPS device or Digital Equipment ALPHA device.

Present memory and PC architectures, such as those discussed above, are rapidly becoming inadequate for constructing the fast machines with substantial storage capacity required to run increasingly sophisticated application software. The problem has already been addressed, at least in part, in the mainframe and server environments by the use of multiprocessor (multiprocessing) architectures. Multiprocessing architectures however are not yet cost effective for application in the PC environment. Furthermore, memory contention and bus contention are still significant concerns in any multiprocessing system, let alone in a multiprocessing PC environment.

Thus, the need has arisen for new memory and system architectures to meet the ever increasing demands for faster processing and greater memory capacity. Such architectures should be comprehensive and cost effective. In other words, a total system solution is required.

SUMMARY OF THE INVENTION

According to a first embodiment of the principles of the present invention, a memory is provided which includes a plurality of banks each including first and second arrays of memory cells, first accessing circuitry for selectively accessing cells in the first array and second accessing circuitry for selectively accessing cells in the second array. Each bank further includes storage circuitry for storing address bits and circuitry for comparing received address bits with stored address bits in the storage circuitry. The first accessing circuitry accesses cells in the first array in response to the stored address bits when the stored address bits and the received address bits match. The second accessing circuitry accesses cells in the second array when the stored address bits and the received address bits differ. The global access control circuitry enables comparison of the stored address bits and the received address bits in a selected one of the plurality of banks.

According to a second embodiment of the principles of the present invention, a memory subsystem is provided including a plurality of memory banks each comprising an array of rows and columns of dynamic random access memory cells, a row decoder for selecting one of the dynamic random access memory cells for access, an array of static random access memory cells coupled to the array of dynamic random access memory cells, and a latch for storing a selected number of row address bits. Each bank further includes comparator circuitry for selectively comparing received row address bits and row address bits stored in the latch of the bank, the comparator circuitry initiating an access to selected cells in the static random access array when the received bits and the stored bits match and initiating an access to selected cells in the dynamic random access array when the received row address bits and the stored row address bits differ. The memory subsystem further includes a global row assignor for enabling the comparator circuitry of a selected one of the banks in response to selected bits of a received row address.

The principles of the present invention are also embodied in methods of accessing data in multiple bank memory systems. According to one such method, an address is received having first and second sets of bits. A first of a plurality of banks is selected in response to the first set of bits and the second set of bits are compared with bits previously stored in first one of the banks. In response to the comparison, a selected one of an SRAM array and a DRAM array in the first of the banks is accessed. In particular, if the second set of bits match the bits stored in the selected bank, the SRAM array is accessed and if the second set of bits stored in the selected banks differ, the DRAM array is accessed.

According to another such method, a first address comprising a first plurality of address bits is received. First data is written to a location in a first one of the banks addressed by the first plurality of bits. The first plurality of bits are also stored in the first bank. The first plurality of address bits are also modified to generate a second plurality of address bits. Second data is then written to a location in a second one of the banks addressed by the second plurality of address bits. The second plurality of address bits are stored in the second bank. A second address, including a third plurality of address bits, is received. The third plurality of address bits are compared with the first and second plurality of bits and the first bank is accessed if the first plurality of bits matches the third plurality of bits and the second bank is accessed if the second plurality of bits matches the third plurality of bits.

The principles of the present invention allow for the construction of high speed memory devices. In particular, the use of SRAM allows data to be clocked out rapidly and with additional drive. Second, by storing spatially and/or temporally adjacent data within multiple banks and then comparing the incoming address with the stored addresses, the probability is increased that required data will already be found in high speed SRAM rather than the lower speed DRAM.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1A:
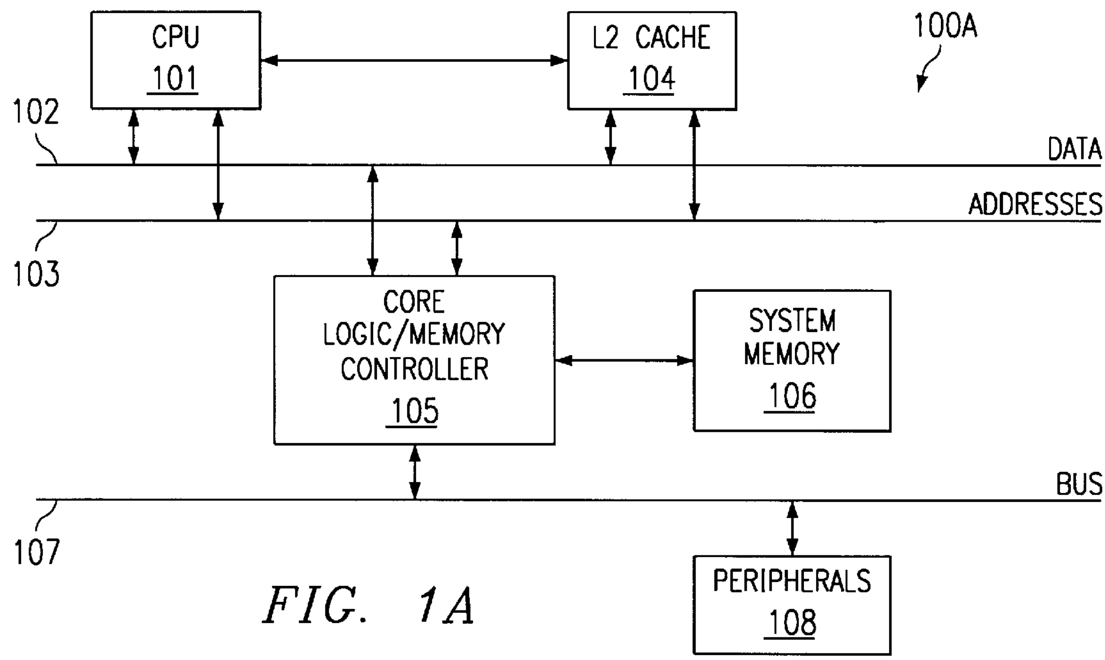
FIGS. 1A and 1B are block diagrams respectively depicting two basic system architectures 100A and 100B typical of those found in personal computers (PCs)
Figure 1B:
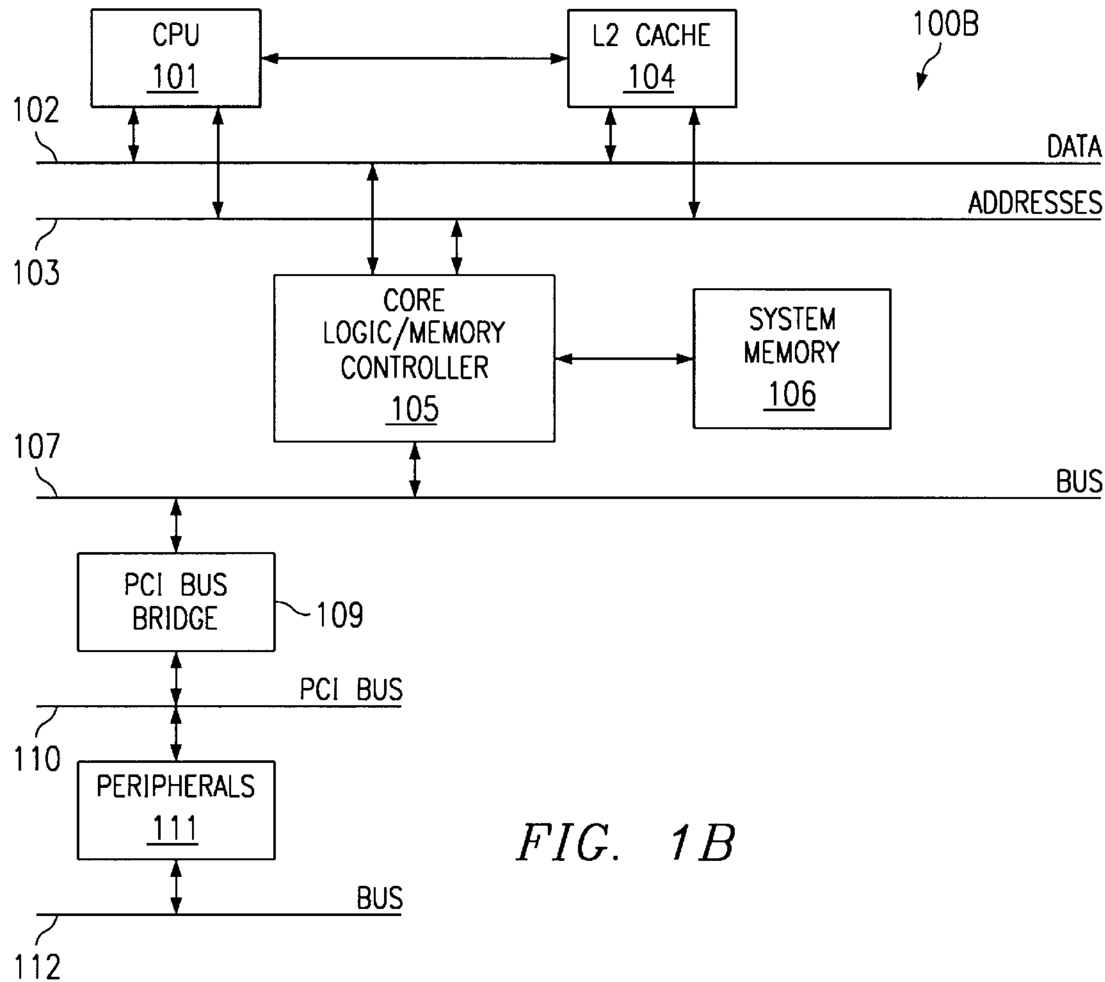

FIGS. 1A and 1B are block diagrams respectively depicting two basic system architectures 100A and 100B typical of those found in personal computers (PCs). While numerous variations on these basic architectures exist, FIGS. 1A and 1B are suitable for describing the basic structure and operation of most PCs.

Both systems 100A and 100B include a single central processing unit 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge then interfaces bus 107 with a PCI bus 110, to which the peripherals 111 couple. An additional bus 112, which may be a ISA, PCI, VESA, IDE, general, or special purpose bus, is provided for access to peripherals 111 from an external device or system (not shown).

In single CPU systems 10A and 100B, CPU 101 is the “master” which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium class microprocessor, a reduced instruction set computer (RISC), such as a Apple PowerPC microprocessor, or a very long instruction word (VLIW) machine.

CPU 101 communicates with the remainder of system 100 via CPU local address and data buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application well known by those skilled in the art. The memory controller can be either a separate device or incorporated into the same chip set as the core logic. The memory controller is generally responsible for generating the memory clocks and control signals such as /RAS, /CAS, R/W and bank select, and monitors and controls cell refresh. The memory controller may also have some address generation capability for accessing sequences of pages.

The core logic is typically comprised of a chip-set, with one or more chips typically being “address and system controller intensive” and one or more chips typically being “data intensive.” Among other things, the address intensive chip(s): interfaces CPU 101 with address bus 103; maintains cache memory, including the cache tags, set associative cache tags and other data necessary to insure cache coherency; performs cache “bus snooping”; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/ memory controller 103 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 107/111 may include a display controller and associated frame buffer, floppy drive controller, disk driver controller, and/or modem, to name only a few options.

The principles of the present invention may also be embodied in multiprocessing devices and systems. Although a number multiprocessing architectures exist to which the principles of the present invention can be applied, FIGS. 2A, 2B and 2C respectively depict exemplary multiprocessor architectures 200A, 200B and 200C for discussion purposes.

Multiprocessing system 200A is based upon n number of CPUs 201. Each CPU 201 is associated with a dedicated cache 202 and dedicated (private) system memory 203. Common bus 204 allows a given CPU to exchange information with peripherals, including mass storage subsystems 204, such as disk drives, tape drives and cartridge units, and Input/Output subsystems 206, such as printers, displays and keyboards.

The memory organization of system 200A is typically categorized under the "no read/write memory access" (NORMA) paradigm. In NORMA based systems, the processors have no access to a common memory and all data sharing between processors occurs over communications links. NORMA typically is used in fully distributed systems.

System 200B also primarily includes n number of CPUs 201, each with an associated cache 202, and coupled to the peripheral devices through a common bus 204. In the case of system 200B, system memory 207 is also coupled to bus 204 and is shared by all the CPUs 201. A second bus 208 is provided as a second path for accessing system memory 207.

The memory architecture of system 200B is typically designated as a unified memory access (UMA) architecture. Under the UMA paradigm, all processors have equal access to system memory and all processors have local cache. The unified memory access architecture typically provides the fastest possible interaction between processors and is the common architecture used in PCs, work stations, and other desktop computing devices. UMA based systems are often referred to as "symmetric-multiprocessing" systems.

System 200C is a system in which both private and system memory are provided. Specifically, in addition to dedicated cache 202, each CPU 201 is also associated with private memory 209. Each CPU is further connected by bus 204 to a shared system memory 210.

The memory architecture of system 200C falls under the non-uniform memory access (NUMA) paradigm. Under the NUMA paradigm, each processor has a private memory and additionally shares system memory with the other processors in the system. One difficulty in a NUMA based system is the fact that the access times for the private and system memories may be different creating timing problems.

Figure 2A:
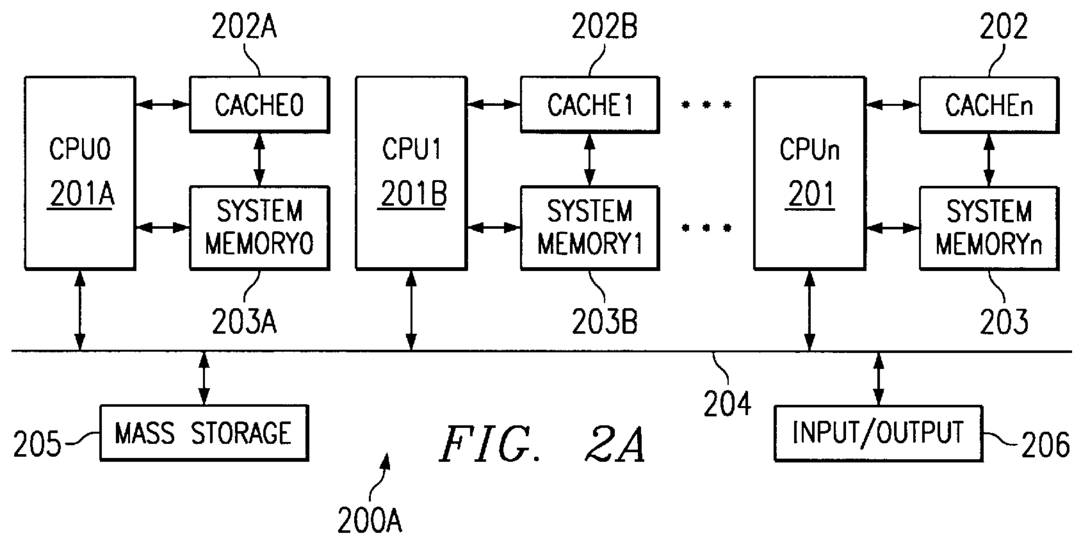
FIG. 2A depicts a multiprocessing system in which each processor operates in conjunction with private system memory.
Figure 2B:
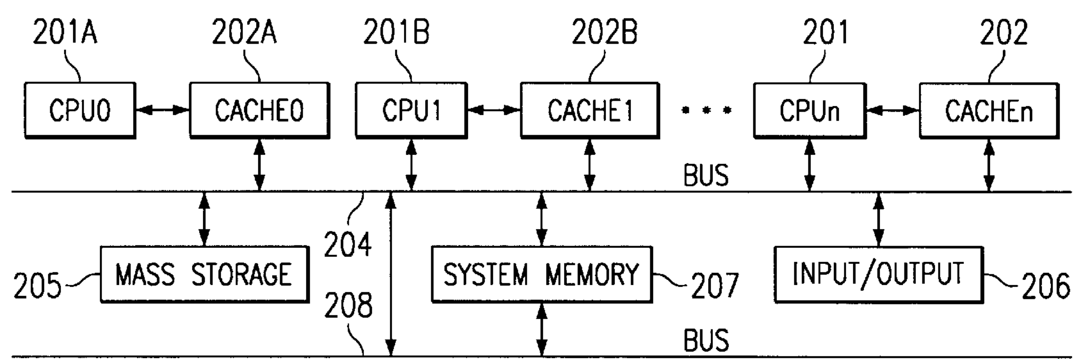
FIG. 2B depicts a multiprocessing system in which each processor operates in conjunction with a public system memory.
Figure 2C:
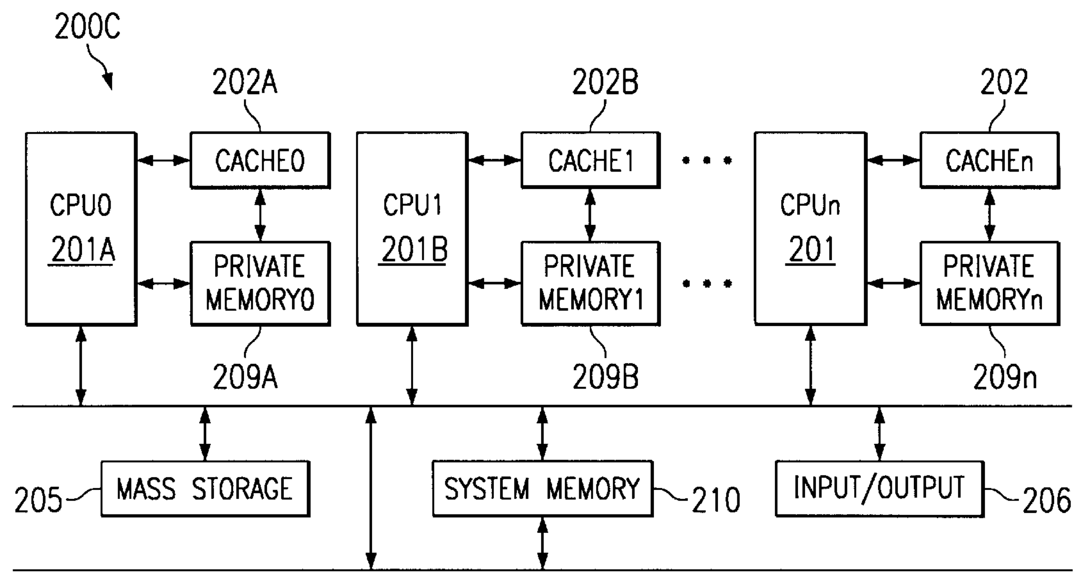
FIG. 2C depicts a multiprocessing system in which each processor operates in conjunction with both private memory and public system memory.

At the highest system level, there are a number of ways to implement the hardware architectures shown in FIGS. 2A, 2B and 2C in a complete hardware/software system. Three such systems are shown in FIGS. 3A–3C, respectively.

Figure 3A:
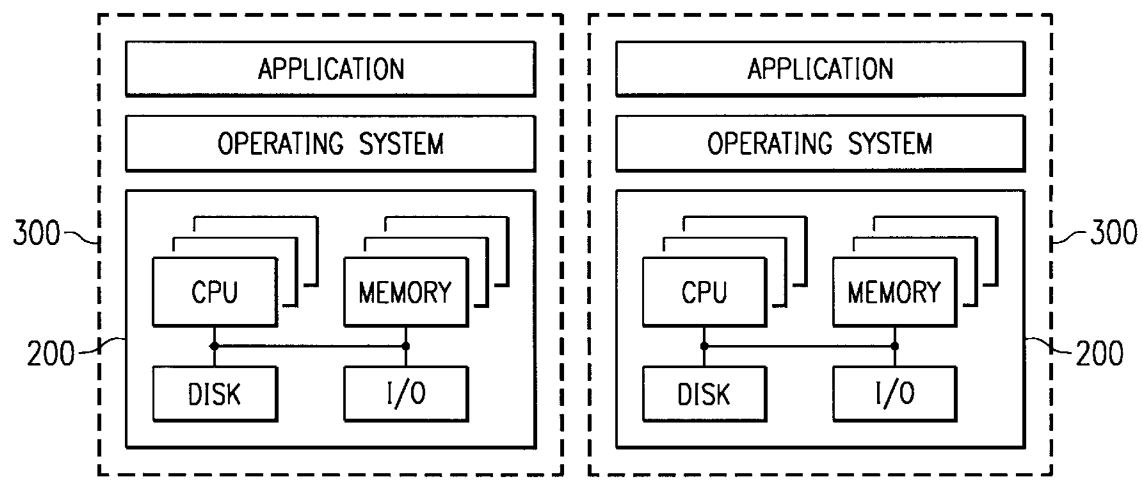
FIG. 3A is a diagram illustrating a “loosely coupled” multiprocessing architecture in which each processing node maintains a dedicated copy of the operating system and a dedicated copy of the applications program.

FIG. 3A is a diagram illustrating a "loosely coupled" multiprocessing architecture. In the loosely coupled architecture, each processing node 300 maintains a dedicated copy of both the operating system and the application programs. Loosely coupled architectures, such as that shown in FIG. 3A, are used often in embedded systems and in real-time systems in which tasks must be partitioned to different processing nodes for synchronization purposes. Embedded systems include those in which the CPU is fabricated on the same chip as logic, memory, a signal processor, or the like. High speed interconnects are used to share data and pass messages between processing nodes 300. While loosely coupled systems are more fault and error tolerant, their software programming is most often highly complex.

Figure 3B:
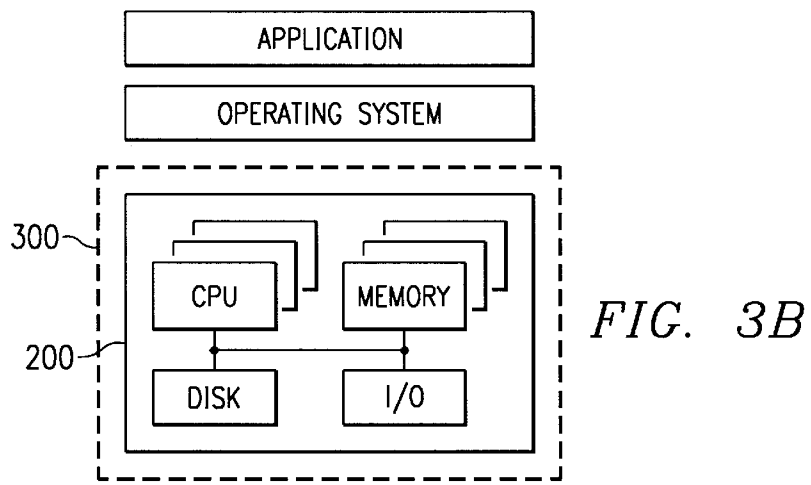
FIG. 3B depicts a “tightly coupled” multiprocessing system in which all processing nodes share a single copy of the operating system and a single copy of the applications program.

FIG. 3B depicts a "tightly coupled" system. In this case, a single copy of the operating system and a single copy of the application program are shared and executed by a single set of processors. Advantageously, writing software programs for a tightly coupled system is normally simpler than for writing programs to a loosely coupled system. However, tightly coupled systems, based only on single copies of the application programs and operating system, are less tolerant to errors and failures than the loosely coupled systems.

Figure 3C:
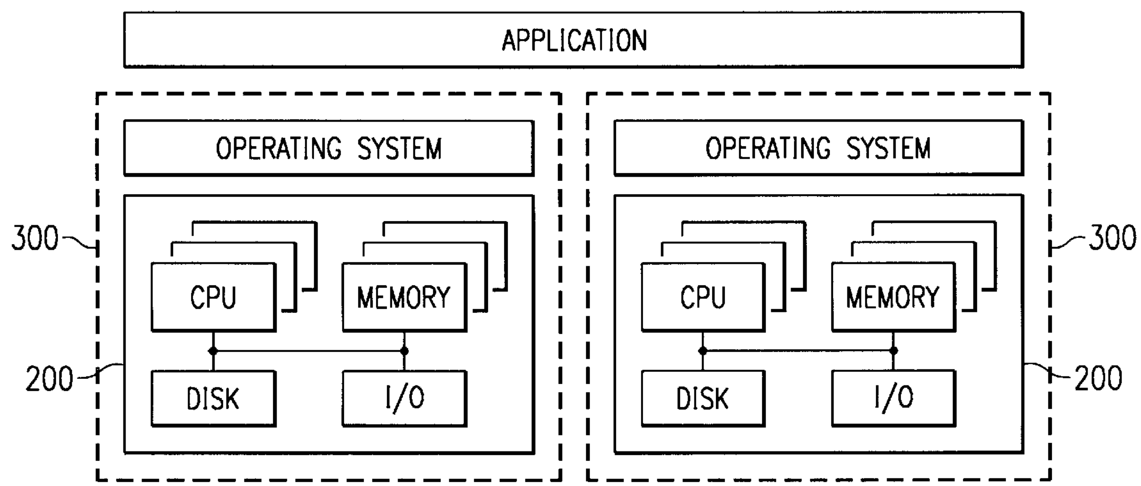
FIG. 3C is a diagram of a “snugly coupled” multiprocessing system in which each processing node maintains a dedicated copy of the operating system and all nodes share a single copy of the applications program.

FIG. 3C is a diagram of a "snugly coupled" system in which each processing node 300 maintains a dedicated copy of the operating system and all nodes share a single copy of the applications program. The snugly coupled variation is a hybrid which provides the tolerance to failure/errors found in loosely coupled systems while still providing the simpler program found in tightly coupled systems.

Generally, under any of the UMA, NUMA or NORMA paradigms, the system will act differently depending upon the type of processor employed. For example, a CISC CPU may be "latency" dominated while a digital signal processor (DSP) based system may be "dataflow" dominated. Further, pipelined processing algorithms typically are dataflow intensive, since the processors perform operations on streams of data received from other processors in the system and then pass the results on to other processors.

There are major challenges which must be addressed in the design of almost any multiprocessing system. First, if an architecture, such as those used in system 200B or system 200C, in which a single system memory system is shared by multiple processors, the issue of memory contention must be addressed; a technique must be developed to handle the situation in which several processors attempt to simultaneously access the shared memory. This problem is compounded by the fact that the contention issues must be dealt with from design to design, since different processors interface with memory differently. For example, a RISC processor requires substantial memory space while a CISC processor requires substantial register space.

In a memory device or subsystem with a single data input/output port and a single address port, contention problems can be solved by "memory locking." In this case, while one CPU (or controller) is accessing a given memory device or subsystem, the other CPU (controller) is "locked out" and cannot access that same device/subsystem. Memory locking is a memory management task which may be performed by the memory management unit (MMU) on-board the CPUs themselves or by a stand-alone device or subsystem. In any event, memory locking reduces the efficiency which multiprocessing was intended to increase, since during a contention situation, at least one processor must wait to access data.

Another major challenge is the software design. Symmetric multiprocessing operating systems are preferred, since this type of operating system is capable of seamlessly passing application programs to the CPUs as they become available. As discussed above, the selection of between tightly, loosely and snugly coupled software architecture requires substantial trade-offs, and in particular trade offs between ease of programming and fault/error tolerance.

Further, when multiple processors (or controllers) are coupled to the same bus, bus contention problems may also arise. Specifically, when a shared bus is employed, only one processor is normally granted access to the bus to perform a given bus task, while the remainder of the processors coupled to that bus must wait until their priority has been reached. One technique for minimizing bus contention problems, is to provide a dedicated cache for each CPU, as shown in FIGS. 3A–3C, so that a given CPU need only access the bus at times when required data are not found in the dedicated cache. As a result, cache coherency is a major concern in the design of a multiprocessing system. In other words, when a given processor modifies a location in memory, some technique must be provided for insuring that the data is modified in the cache memory of each of the other processors using the same data.

Figure 4:
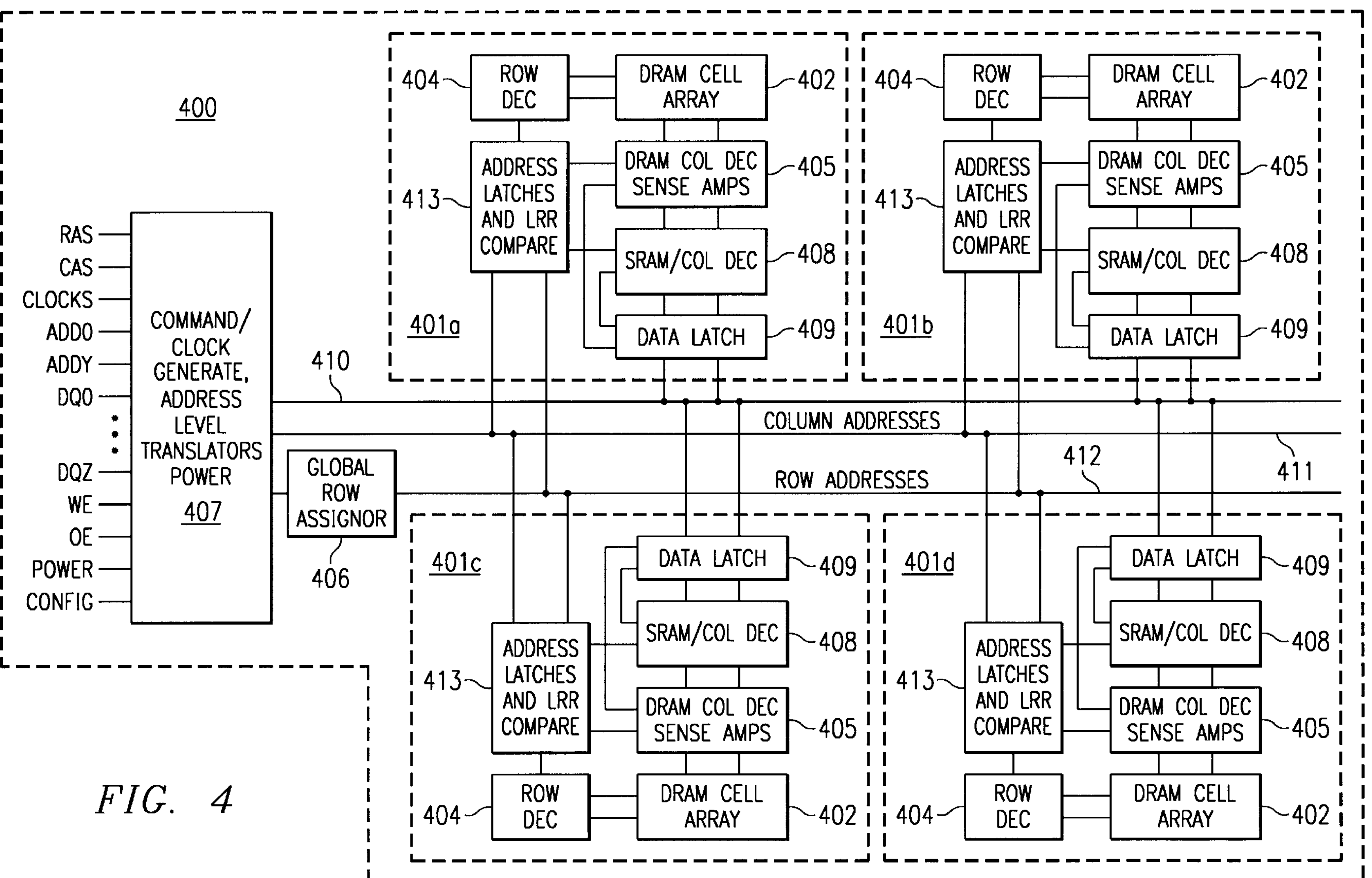
FIG. 4 is a functional block diagram of a dynamic random access memory device according to one embodiment of the principles of the present invention.

FIG. 4 is a functional block diagram of a dynamic random access memory device 400 according to one embodiment of the principles of the present invention. Memory 400 includes N number of memory banks or units 401, with four such banks 401*a*, 401*b*, 401*c*, and 401*d* being shown in FIG. 4 for discussion; the actual number of banks will vary from application to application, although N is preferably an even number two or greater. Banks 401 communicate with external circuitry through control and configuration circuitry 407, discussed further below. In single CPU processing systems, such as systems 100*a* and 10*b*, memory subsystem 400 may be used to construct system memory 102, although many other applications in the single CPU personal computer environment are possible, such as in the display frame buffer. In multiprocessing architectures, such as systems 200*a*, 200*b*, and 200*c*, memory subsystem 400 can be used to construct either the system memories or the local (private) memories. Preferably, subsystem 400 is a monolithic integrated circuit device.

Each bank 401 includes an array 402 of dynamic random access memory (DRAM) cells arranged in N number rows and M number columns. As is known to those skilled in the art, each array 402 may be partitioned into multiple subarrays, with the columns organized using either an open-bitline or folded-bitline approach. Each bank 401 further includes a traditional DRAM row decoder 404 coupled to the array wordlines, and traditional DRAM sense amplifiers/column decoder circuitry 405 coupled to the array bitlines. The row and column decoders are preferably organized in hierarchical fashion in which a main decoder and one or more levels of subdecoders/drivers are used. Generally, each row decoder 404, in response to a row address, selects one of N rows for access during an active cycle when the row address strobe /RAS is in a logic low state. Column decoder selects P number of pages (locations) of C number of columns (bits) from the M total number of columns in response to P number of column addresses for access during an active cycle.

Global row assignor 406 performs a "coarse granularity decoding" using L number of least significant row address bits from each received row address. Specifically, all banks 401 are active during each /RAS cycle, and global row assignor using the L least significant row address bits to select. Row decoders 404 consequently decode the Y-1 number of remaining most significant address bits to simultaneously select one row per /RAS cycle in each DRAM array during a DRAM access.

Control circuitry 407 receives conventional DRAM control signals and clocks from an external source, such as processor 101 or core logic 105 in system 100 or CPUs 201 in multiprocessing systems 200A–200C. These signals include a synchronous clock (SCLK), a row address strobe (/RAS), a column address strobe (/CAS), read/write select (R/W) and output enable (/OE), along with data (DQ) and addresses ($A_{dd}$). Control circuitry 407 also inputs a configuration bit (CONFIG), discussed below. In the preferred embodiment, the address input port is multiplexed in a conventional manner wherein row addresses and column addresses are received sequentially at the same pins and latched in with /RAS and /CAS respectively.

According to the principles of the present invention, each bank 401 further includes static random access memory (SRAM)/SRAM column decoder circuitry 408. SRAM circuitry 408 will be discussed in further detail in conjunction with FIG. 6, but can generally be described at this point as follows. First, a linear array of M number of SRAM cells is included for storing a row of data transferred from the corresponding DRAM array 402. Second, SRAM column decoder circuitry is included for page access (reads or writes) of C-bit wide pages of data to the row of data in SRAM array in response to one or more column addresses.

Data latches 409 interface the DRAM sense amplifiers/column decoders 405 and the SRAM column decoders 408 with a data bus 410. Column addresses are transferred via a column address bus 411 and row addresses by a row address bus 412.

Address latches and last row read (LRR) compare circuitry 413 includes latches for storing the current row and column addresses received at the address port $A_{dd}$0–$A_{dd}$Y. Also included as part of circuitry 413 are latches for storing the high order (MSB) row address bits of the last row read (LRR) and comparison circuitry for comparing the stored LRR bits to the high order bits (MSB) of the current row address.

It should be noted that while in the illustrated embodiment the least significant row address bits are processed by global assignor 406 and the most significant row address bits are used internal to the banks 401 to select individual rows of cells, other arrangements will just as easily apply. For example, a given number of most significant row address bits could be used by global row assignor 406 and the remaining least significant bits used for individual row select. Further, either big- or little-endian data structures can be used. The number of address bits presented to the SRAM cache of a given bank 408 is identical to the number of MSB address bits presented to DRAM row decoder 404.

Figure 5:
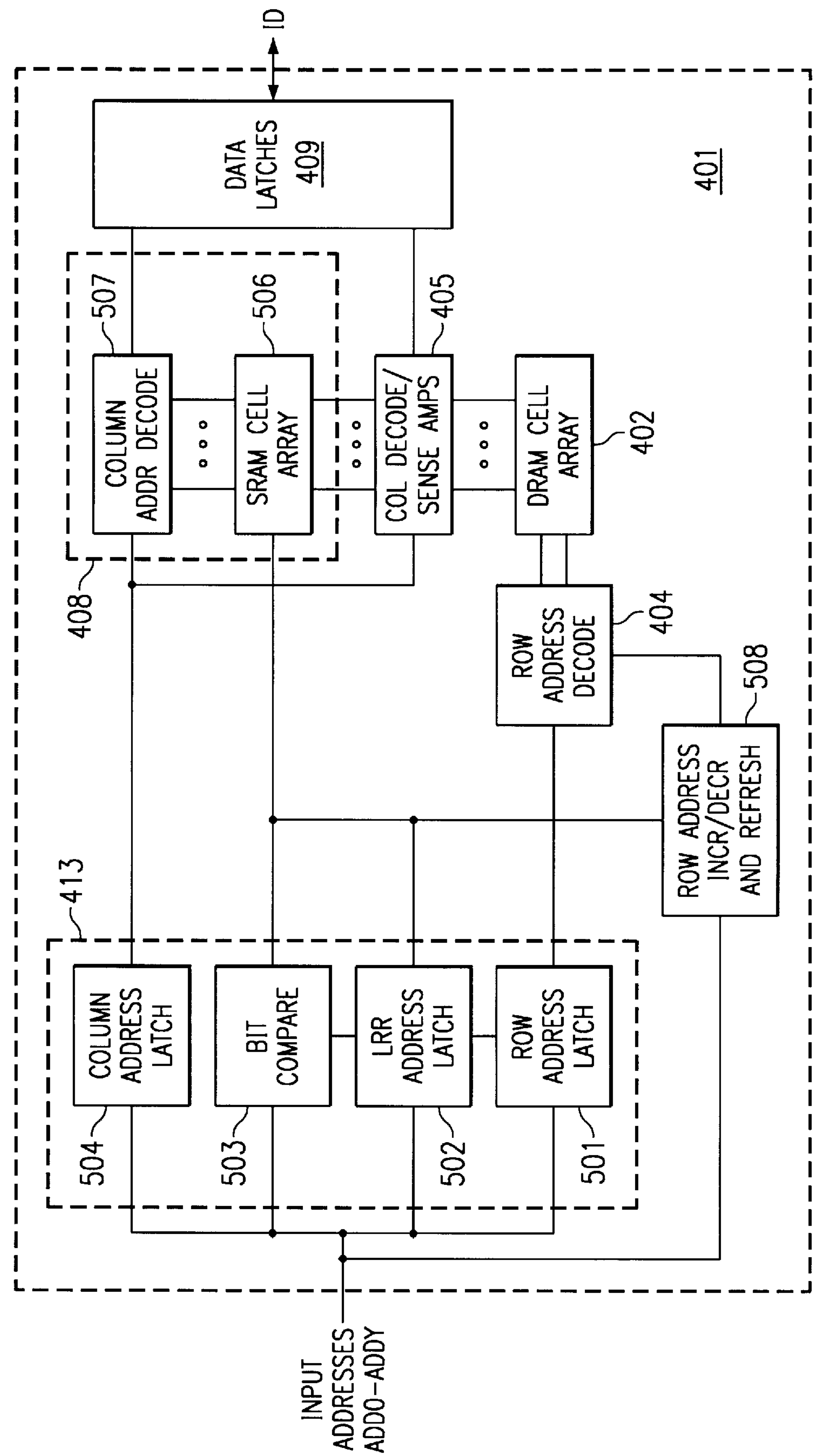
FIG. 5 is a more detailed diagram emphasizing the data and address routing circuitry of the memory shown in FIG. 4.

FIG. 5 is a more detailed diagram emphasizing the data and address routing circuitry of a selected bank 401. Addresses are received in a multiplexed fashion at the address port Add0–AddY. The row address bits are latched on the falling edge of /RAS (which follows the SCLK) into row address latch 501. The most significant bits are presented to the fine granularity row decoders 404 and the least significant bits to the global row assignor 406. The most significant row address bits from the previous (last) /RAS cycle are transferred to last row read address latch 502. Comparison circuitry 503 compares the most significant row address bits latched into row address latch 501 and the last read row address held in latch 502. During each /CAS cycle, one or more column addresses are received at address port Add0–AddY and latched into column address latch 504 with each falling edge of /CAS.

SRAM registers 506 store data associated with the address bits stored last read address latch 502 (i.e., assuming that row addresses and data are considered together as a data structure, the row address MSBs comprise the row field and the data bits, the data field). A second column decoder 507 is provided to access locations in SRAM registers 506. Row address increment/decrement and refresh control circuitry 508, when enabled, steps through the rows of array 402 to perform cell refresh through the DRAM sense amps and implements the address transformations detailed below.

Preferred methods of operating memory 400 can now be described. During an access, a row address is first received at address pins Add0–AddY. On the falling edge of /RAS, the least significant row address bits (in the four bank embodiment, the two least significant bits) are passed to global row assignor 406 and the remaining most significant bits are latched into row address latch 501 of each bank 401. The most significant bits stored in each row address latch 501 from the previous /RAS cycle are transferred into the corresponding LRR address latch 502.

In a first method of reading, the bit CONFIG at the input to memory 400 is set to a logic low. Global row assignor 406 determines from the current least significant row address bits the bank 401 which corresponds to the address space of the received address. The comparator 503 of the corresponding bank 401 is enabled such that during the period between the falling edge of /RAS and the first high to low transition of /CAS, that comparator 503 compares the current address most significant bits in the corresponding row address latch 501 and bits stored in LRR address latch 502. If a match occurs for the given bank, the SRAM column address decoders 507 are selected and set-up to access the complete SRAM cell array 506 of that bank. Column addresses received at the address port Add0–AddY are latched into column address latches 504 of each bank and each SRAM column decoder 507 accordingly allows access to a C-bit word per each of P number of column addresses latched-in with /CAS. The accesses are implemented through a C-bit wide data bus 410; if for example, each bank is organized as a by 16 device, data bus 410 is 16-bits wide and so on. Preferably, the selected (enabled) bank is the only bank 401 accessed via data bus 410, the word of data in the data latches 409 of the other banks is simply not used.

If the address bits in latches 501 and 502 do not match for the bank 401 addressed by the received row address LSBs, access must be made to the corresponding DRAM array. Specifically, for a read to the addressed bank 401, the row is selected by DRAM row decoder 404 from the corresponding DRAM array 402 and an entire row of data transferred to the associated SRAM array 506 for output when the column addresses are presented. For the remaining banks 401, the MSBs are incremented or decremented using the corresponding row address increment circuitry 508. A row of data for these banks is similarly transferred to the corresponding SRAM arrays 507.

Assume for example, in the illustrated four bank system, that the received row address has LSBs 01 indicating the address space of bank 401*b* (Bank1) is to be accessed. Global row assignor 406 hence enables Bank1 to make the comparison of the row current address MSBs and the bits stored in the Bank1 LRR latch. The row address MSBs as received are not modified for transferring data from the bank 401*b* DRAM array 402 to the Bank1SRAM array. However, for bank 401*a* (Bank0) the row address MSBs are decremented by 01 by the corresponding row increment circuitry 508 and the row address MSBs for banks 401*c* (Bank2) and 401*d* (Bank3) are incremented by 01 and 10 respectively. In other words, if the address to Bank1 (the received row address MSBs) is designated address A+1, then address A+1 is decremented by one such that Bank0 receives address A0 and incremented such that Bank2 receives address A+2 and Bank3 receives address A+3. These addresses are used to access the associated bank's DRAM array 402 and the accessed data in DRAM transferred to the SRAM arrays. The new addresses are stored in address latches 501.

During accessing of the addressed bank, assuming again for discussion purposes BANK1, the DRAM of any bank, including in this case the DRAM array 402 of Bank1 can be refreshed. The DRAM column decoders 405 isolate the corresponding DRAM arrays 402 from the SRAM arrays 408. Thus, while data is being accessed from the SRAM array of the selected bank 401, any or all of the DRAM arrays 402 can be refreshed without disturbing the data in the SRAM arrays. Refresh is preferably performed by incrementing the row addresses in each bank using increment and refresh circuitry 508 and latching each row of data using the DRAM sense amplifiers 405 in a conventional fashion.

In the preferred embodiment, once the data in the SRAM array 506 of the addressed (selected) bank has been accessed, the /RAS cycle is complete. The data in the SRAM arrays 506 of the remaining banks 401 is available through the associated data latches 409, and could be used, but typically is reserved for future /RAS cycles. The current row address MSBs for the selected banks and the new row address MSBs are transferred to the LRR registers during the next /RAS cycle. The corresponding data remain in the SRAM arrays. Advantageously, since the CPU and/or operating system typically accesses data within temporally or spacially adjacent areas in memory, the probability is substantial that a match will occur.

For a write the following is the preferred method. An address is received at address port Add0–AddY. From the LSBs, global row assignor 406 determines the bank 401 assigned to the corresponding row address space. Assume again for example, the LSBs are 01, addressing bank 401*b* (Bank1). The received row MSBs are taken as the address to the Bank1 DRAM array 402. As was done above, the row address increment circuitry 508 for Bank0 decrements the received row MSBs to obtain a row address to the Bank0 DRAM array and increments the received MSBs by 01 and 10 to obtain row addresses to the DRAM arrays of Bank2 and Bank3 respectively. The MSB row address bits for each bank 401 is written into the bank's LRR register 502.

In a second method of accessing, the CONFIG bit at the input to memory 400 is set high. In this case, during an access, the MSBs of a received address are compared by all the comparators 503. If a match occurs in any one or more banks 401, the data from all the banks is taken, although the data from the non-matching banks may be discarded or left in the data latches.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A memory comprising:

a plurality of banks each including:

an first array of memory cells;

a second array of memory cells;

first accessing circuitry for selectively accessing cells in said first array;

second accessing circuitry for selectively accessing cells in said second array;

storage circuitry for storing address bits; and circuitry for comparing received address bits with stored address bits in said storage circuitry, said first accessing circuitry accessing cells in said first array addressed by said stored address bits when said stored address bits and received address bits match and said second accessing circuitry accessing cells in said second array addressed by said received address bits when said stored address and said received address bits differ;

global access control circuitry operable to enable comparison of said stored address bits and said received address bits in a selected one of said plurality of banks; and circuitry for selectively modifying said received bits to generate second bits for updating contents of said storage circuitry and said first array of memory cells of a second selected one of said banks, said second address bits accessing cells in said second array of said second bank having a predetermined locality with respect to said cells in said second array of said first bank accessed by said received address bits.

2. The memory of claim 1 wherein said first array comprises an array of static random access memory cells.

3. The memory of claim 1 wherein said second array comprises an array of dynamic random access memory cells.

4. The memory of claim 1 wherein said first accessing circuitry comprises a column decoder for selecting a location along a row in said first array.

5. The memory of claim 1 wherein said second accessing circuitry comprises a row decoder for selecting a row in said second array and a column decoder for accessing cells along said selected row.

6. The memory of claim 1 wherein said first and second circuitry for accessing is operable to transfer a selected set of data from said second array to said first array.

7. The memory of claim 1 and further comprising a data latch coupled to said first and second accessing circuitry.

8. A memory subsystem comprising:

a plurality of memory banks each comprising:

an array of rows and columns of dynamic random access memory cells;

a row decoder for selecting a said one of said of dynamic random access memory cells for access;

an array of static random access memory cells coupled to said array of rows and columns of dynamic random access memory cells;

a latch for storing a selected number of row address bits; and comparator circuitry for selectively comparing received row address bits and row address bits stored in said latch, said comparator circuitry initiating an access to selected cells in said static random access array when said received bits and said stored bits match and initiating an access to selected cells in said dynamic random access array when said received row address bits and said stored row address bits differ;

a global row assignor for enabling said comparator circuitry of a selected one of said banks in response to selected bits of a received row address; and circuitry for updating data in said static random access memory cells of a second selected one of said banks such that said static random access memory cells of said first and second banks store data within a predetermined locality.

9. The memory subsystem of claim 8 wherein said plurality of banks are fabricated on a single integrated circuit chip.

10. The memory subsystem of claim 8 wherein said array of static random access memory cells comprises one row of cells, said row of cells having a width equal to a row of cells in said dynamic random access memory array.

11. The memory subsystem of claim 8 and further comprising an SRAM column decoder coupled to said static random access memory array for accessing locations of a row of static random access memory cells in response to received column addresses.

12. The memory subsystem of claim 8 and further comprising a DRAM column decoder coupled to said array of dynamic random access memory cells for accessing locations of a row of dynamic random access memory cells in response to received row addresses.

13. The memory subsystem of claim 8 wherein said comparator circuitry compares a selected number of most significant bits of a received row address with a selected number of most significant bits of a previously received row address and stored in said latch.

14. The memory subsystem of claim 13 wherein said global row assignor circuitry enables said comparator circuitry of said selected bank in response to a selected number of least significant bits of said received address.

15. The memory subsystem of claim 8 and further comprising row address increment/decrement circuitry for transforming selected bits of a received address for storage in said latch of a non-selected on of said banks.

16. The memory subsystem of claim 15 wherein said transformed bits are within an address space adjacent to said selected bits of said received address.

17. A method of accessing data in a multiple bank memory system comprising the steps of:

receiving an address having first and second sets of bits;

selecting a one of a plurality of banks with in response to the first set of bits;

comparing the second set of bits with bits stored in the selected one of the banks; and in response to said step of comparing, accessing a selected one of an SRAM array and a DRAM array in the selected one of the banks, comprising the substeps of:

if the second set of bits match the bits stored in the selected bank, accessing the SRAM array; and if the second set of bits and the bits stored in the selected bank differ, accessing the DRAM array; and updating data stored in an SRAM array of a second bank comprising the substeps of:

modifying the second set of bits to generate a third set of bits addressing data in a DRAM array of the second bank, the addressed data having a predefined locality with respect to data accessed from with the DRAM array of the first bank;

transferring the addressed data from the DRAM array in the second bank to an SRAM array in the second bank; and storing the third set of bits in the second bank.

18. The method of claim 17 wherein said substep of accessing the DRAM array comprises the substep of transferring selected data from the DRAM array to the SRAM array of the selected bank.

19. The method of claim 17 wherein said first set of address bits comprise least significant row address bits and said second set of bits comprise most significant row address bits.

20. The method of claim 17 and further comprising the steps of:

in response to said step of comparing, modifying the second set of bits to generate a third set of bits;

transferring data from a DRAM array in a second one of the banks to an SRAM array in the second one of the banks in response to the third set of addresses; and storing the third set of bits in the second bank.

21. The method of claim 20 and further comprising the steps of:

receiving a second address, the second address having first and second sets of bits; and comparing the second set of bits of the second address with the third set of bits stored in the second one of the banks in response to said step of comparing, accessing a selected one of an SRAM array and a DRAM array in second one of the banks, comprising the substeps of:

if the second set of bits of the second address match the third set of bits stored in the second bank, accessing the SRAM array of the second bank; and if the second set of bits of the second address and the third set of bits stored in the second bank differ, accessing the DRAM array of the second bank.

22. The method of claim 17 wherein said substep of accessing the SRAM comprises the substep of receiving a sequence of column addresses and accessing in response a plurality of storage locations within the SRAM array.

23. The method of claim 20 wherein said step of modifying the second set of bits comprises the step of modifying the second set of bits to generate a third set of address bits addressing a set of data in the DRAM of the second bank within an address space adjacent to the address space addressed by the second set of address bits.

24. A method of accessing to a multiple bank memory subsystem comprising the steps of:

receiving a first address comprising a first plurality of address bits;

writing first data to a location in a first one of the banks addressed by the first plurality of bits;

storing the first plurality address bits in the first bank;

modifying the first plurality of address bits to generate an second plurality of address bits, the second plurality of address bits addressing a location in a second one the banks for storing bits having a predetermined locality with bits stored in the first bank;

writing second data to a location in a second one of the banks addressed by the second plurality of address bits;

storing the second plurality of address bits in the second bank;

receiving a second address including a third plurality of address bits; and comparing the third plurality of bits with the first and second plurality of bits and accessing the first bank if the first plurality of bits matches the third plurality of bits and accessing the second bank if the second plurality of bits matches the third plurality of bits.

25. The method of claim 24 wherein said first and second addresses comprise row addresses.

26. The method of claim 24 wherein said step of modifying the first address comprises the step of modifying a least significant bit.

* * * * *

UNITED STATES PATENT AND TRADEMARK OFFICE

CERTIFICATE OF CORRECTION

PATENT NO. : 5,835,932
APPLICATION NO. : 08/816663
DATED : November 10, 1998
INVENTOR(S) : G. R. Mohan Rao It is certified that error appears in the above-identified patent and that said Letters Patent is hereby corrected as shown below:

On Title Page item 56
On page 1, column 1, under the heading "References Cited":

4,894,770 ~~4,897,770~~ 1/1990 Ward et al. .......................................................711/128

Change "4,897,770" to --4,894,770--

Signed and Sealed this

Twenty-second Day of May, 2007

JON W. DUDAS
*Director of the United States Patent and Trademark Office*